United States Patent
Chiu et al.

(10) Patent No.: US 11,764,769 B1
(45) Date of Patent: Sep. 19, 2023

(54) CONTROL CIRCUIT AND METHOD FOR DETECTING BUS GLITCH SIGNAL

(71) Applicant: Nuvoton Technology Corporation, Hsinchu (TW)

(72) Inventors: Ta-Chin Chiu, Hsinchu (TW); Chieh-Sheng Tu, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 17/860,050

(22) Filed: Jul. 7, 2022

(30) Foreign Application Priority Data

Apr. 21, 2022 (TW) .................................. 111115183

(51) Int. Cl.
| | | |
|---|---|---|
| *H03K 5/00* | (2006.01) | |
| *H03K 5/1252* | (2006.01) | |
| *H03K 5/24* | (2006.01) | |
| *H03K 5/08* | (2006.01) | |
| *H03K 19/0175* | (2006.01) | |

(52) U.S. Cl.
CPC ........... *H03K 5/1252* (2013.01); *H03K 5/086* (2013.01); *H03K 5/249* (2013.01); *H03K 19/017509* (2013.01)

(58) Field of Classification Search
CPC ...... H03K 5/1252; H03K 4/086; H03K 5/249; H03K 19/017509
See application file for complete search history.

(56) References Cited

U.S. PATENT DOCUMENTS

| | | | | |
|---|---|---|---|---|
| 6,779,046 B1 * | 8/2004 | Osuga | ...................... | G06F 1/12 710/14 |
| 6,947,335 B2 * | 9/2005 | Nakamura | ........... | G11C 7/1006 326/88 |
| 7,919,982 B1 * | 4/2011 | Chen | .............. | H03K 19/018592 326/62 |
| 2004/0010728 A1 * | 1/2004 | Musumeci | ........... | H03K 5/1252 713/400 |
| 2006/0282592 A1 * | 12/2006 | Zakriti | ................ | G06F 12/0669 711/E12.087 |
| 2010/0244919 A1 * | 9/2010 | Horton | ................. | H03K 5/1252 327/261 |

FOREIGN PATENT DOCUMENTS

| | | |
|---|---|---|
| CN | 101436095 | 5/2009 |
| CN | 103530215 | 1/2014 |
| CN | 113946480 | 1/2022 |

OTHER PUBLICATIONS

"Notice of Allowance of Taiwan Counterpart Application", dated Nov. 23, 2022, p. 1-p. 3.

* cited by examiner

*Primary Examiner* — Tuan T Lam

(74) *Attorney, Agent, or Firm* — JCIPRNET

(57) ABSTRACT

A control circuit and method for detecting a glitch signal on a bus are provided. The control circuit includes: input ends, respectively receiving a data signal and a clock signal from the bus; a counter, for calculating a time or a number of times in a low level period of the clock signal; a comparator, receiving an output of the time counted by the counter and a threshold value, and generating a comparison result by comparing the time and the threshold value; and an error detector, coupled to the comparator to receive the comparison result, and generating an error flag. When the comparison result indicates that there is a level change during the low level period of the clock signal, the error detector generates an error flag.

14 Claims, 5 Drawing Sheets

CONTROL CIRCUIT AND METHOD FOR DETECTING BUS GLITCH SIGNAL

CROSS-REFERENCE TO RELATED APPLICATION

This application claims the priority benefit of Taiwan application serial no. 111115183, filed on Apr. 21, 2022. The entirety of the above-mentioned patent application is hereby incorporated by reference herein and made a part of this specification.

BACKGROUND

Technical Field

The present invention relates to a control circuit and a method for detecting a bus glitch signal.

Description of Related Art

The hardware configuration of the I²C bus provides two lines, one of which is the data line for transmitting a data signal SDA (Serial Data Line) and the other is the clock line for transmitting a clock signal SCL (Serial Clock Line). All I²C devices are connected to the two lines in parallel. I²C has three types of signals in the processing of transmitting data, which are start signal, end signal and response signal. The start signal means that when the clock signal SCL is at the high level, the data signal SDA drops from the high level to the low level, and data transmission starts. The end signal is that when the clock signal SCL is at the high level, the data signal SDA is raised from the low level to the high level, and the data transmission is terminated.

If the signal waveform of the I²C bus is deformed, the slave device on the I²C bus will malfunction. The deformed I²C waveform may be caused by glitch signal, hardware design, or the control process of the IC itself. For example, the I²C bus uses transistors (such as a MOS-FET) to realize a level shift to convert the voltage. If the I²C waveform is deformed, the I²C device may malfunction. There will be a 3V I²C bus and a 5V I²C bus in the level shift. However, if the signal on one side is at the low level, the signal on the other side will also be pulled down to the low level.

As shown in FIG. 1, on the 3V I²C clock signal SCL, the signal is on the falling edge, after it passes through the transistor (MOS-FET) circuit, the glitch signal will be seen in the 5V I²C clock signal SCL, that is, the glitch signal is generated on the I²C clock signal SCL. The signal that should be at the low level becomes at the high level. At this time, the slave device on the I²C bus will misjudge the glitch signal as the start signal of the I²C bus, and then malfunctions and makes incorrect behavior. This problem will make it difficult for users to detect errors by themselves, and it is not easy to determine the correctness of the waveform.

Therefore, the controller of the circuit (such as, microcontroller, MCU) needs to determine that there is an error in the waveform, so as to prevent the device from malfunctioning. In this manner, the problem can be solved.

SUMMARY

Based on the above description, according to an embodiment of the present invention, a control circuit for detecting a busbar interference signal is provides and includes: input ends, respectively receiving a data signal and a clock signal from the bus; a counter, for calculating a time or a number of times in a low level period of the clock signal; a comparator, receiving an output of the time counted by the counter and a threshold value, and generating a comparison result by comparing the time and the threshold value; and an error detector, coupled to the comparator to receive the comparison result, and generating an error flag. When the comparison result indicates that there is a level change during the low level period of the clock signal, the error detector generates an error flag.

According to an embodiment of the present invention, in the above control circuit, the counter may be configured to measure a measurement time that the data signal is at a low level before the clock signal becomes a low level. The comparator compares the measurement time with the threshold value, and the error detector generates the error flag when the measurement time is less than the threshold value. The threshold value is a hold time for start condition defined by the bus.

According to an embodiment of the present invention, in the above control circuit, the counter is configured to measure a measurement time during the low level period of the clock signal. The comparator compares the measurement time with the threshold vale, and when the measurement time is less than the threshold value, the error detector generates the error flag. The threshold value is a default value of the low level period defined by the bus.

According to an embodiment of the present invention, in the above control circuit, the control circuit may further comprise an accumulator, coupled to the counter for accumulating the low level period of each cycle of the clock signal.

According to an embodiment of the present invention, in the above control circuit, the control circuit may further comprise a first level determination element and a second level determination element for respectively receiving the clock signal, respectively determining a level of the clock signal, and respectively outing an output signal of high or low level. The counter further comprises a first counting unit for receiving and counting a falling edge or a rising edge of the output signal of the first level determination element to generate a first count value, and a second counting unit for receiving and counting a falling edge or a rising edge of the output signal of the second level determination element to generate a second count value. The comparator compares the first count value with the second count value to generate the comparison result. The error detector generates the error flag when the first count value is inconsistent with the second count value based on the comparison result.

According to an embodiment of the present invention, in the above control circuit, the first level determination element is a TTL level determination element, and the second level determination element is Smith Trigger level determination element.

According to an embodiment of the present invention, in the above control circuit, the control circuit further comprises a first level determination element and a second level determination element for respectively receiving the clock signal, respectively determining a level of the clock signal, and respectively outing an output signal of high or low level. The counter may be configured that when the first level determination element determines that the output signal has a falling edge or a rising edge, a count value of the counter is increased by one unit; when the second level determination element determines that the output signal has a falling edge or a rising edge, the count value is decreased by one unit. The error detector generates the error flag when the count value of the counter is not 0.

According to another embodiment of the present invention, a method for detecting glitch signal on a bus is provided. The method comprises receiving a data signal and a clock signal of the bus; calculating a time or a number of times based on a low level period of the clock signal; comparing the time with a threshold value to generate a comparison result; and based on the comparison result, when the comparison result indicates that there is a level change during the low level period of the clock signal, generating an error flag.

According to an embodiment of the present invention, in the above method, calculating the time is to measure a measurement time that the data signal is at a low level before the clock signal becomes a low level, and the threshold value is a hold time for start condition defined by the bus, and the error flag is generated when the measurement time is less than the threshold value.

According to an embodiment of the present invention, in the above method, calculating the time is to measure a measurement time during the low level period of the clock signal, and the threshold value is a default value of the low level period defined by the bus, and the error flag is generated when the measurement time is less than the threshold value.

According to an embodiment of the present invention, in the above method, the method may further comprise: accumulating the low level period of each cycle of the clock signal.

According to an embodiment of the present invention, in the above method, the method may further comprise: using a first level determination method and a second level determination method, respectively determining a level of the clock signal and outputting an output signal of high or low level; counting the falling edge or the rising edge of the output signal generated by the first level determination to generate a first count value; counting the falling edge or the rising edge of the output signal generated by the second level determination method to generate a second count value; comparing the first count value with the second count value to generate the comparison result; and based on the comparison result, generating the error flag when the first count value is inconsistent with the second count value.

According to an embodiment of the present invention, in the above method, the first level determination method may be based on TTL, and the second level determination method is based on a Schmitt trigger level determination element.

According to an embodiment of the present invention, in the above method, the method may further comprise: using a first level determination method and a second level determination method, determining a level of the clock signal and outing an output signal of high or low level; when the first level determination method determines that the output signal has a falling edge or a rising edge, a count value is increased by one unit; when the second level determination method determines that the output signal has a falling edge or a rising edge, the count value is decreased by one unit; and when the count value is not 0, generating the error flag.

According to the above descriptions, the embodiments of the present invention provide several methods to detect whether the clock signal of the bus has abnormal state transition during the low level period, in order to determine whether the bus is disturbed. In the case of occurrence of the glitch signal, the system can send an error flag to make the bus device ignore the corresponding action of this cycle to avoid malfunction.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The embodiment of the present invention proposes a method for determining whether an abnormal signal is occurred on a bus, and the bus is, for example, an I²C bus. According to the method and circuit configuration of the present embodiment, the device on the I²C bus can be prevented from being affected by the glitch signal and thus prevented from performing wrong operations.

Figure 2:
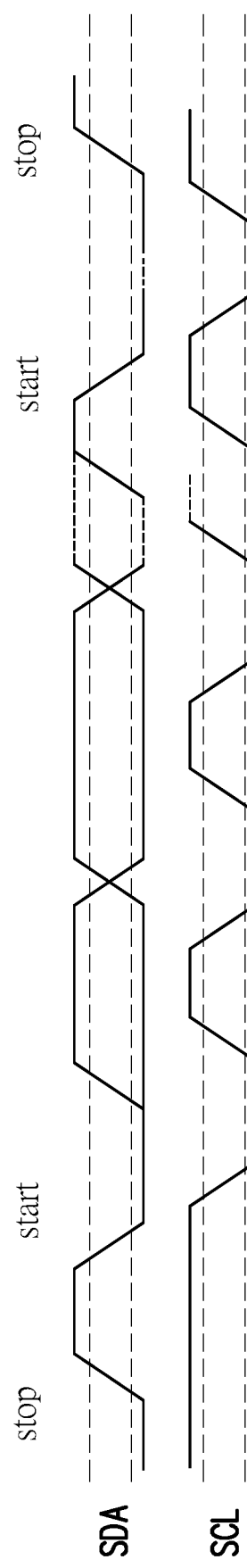
FIG. 2 is a schematic diagram of waveforms used for determining whether an abnormal signal is occurred on a bus according to an embodiment of the present invention.

FIG. 2 is a schematic diagram of waveforms for illustrating a method for determining whether an abnormal signal is occurred on a bus according to an embodiment of the present invention.

The first method described in this embodiment is to use the hold time for start condition tHD,STA, which is a standard parameter in the I²C bus specification, to determine whether there is an abnormal signal (waveform) in the clock signal SCL. According to the I²C bus specification, the hold time for start condition tHD, STA is used to determine the start condition. The hold time for start condition tHD, STA generally refers to the shortest time that the data signal SDA should be at the low level before the clock signal SCL becomes the low level. For example, the hold time for start condition tHD,STA may typically be measured as the time required for the data signal SDA to transition from 30% of the high-to-low amplitude to 70% of the high-to-low amplitude of the clock signal SCL. The I²C bus specification defines a minimum value of the holding time tHD,STA, and therefore, the hold for start condition tHD,STA can be used to determine whether the waveform of the start condition is qualified.

Figure 1:
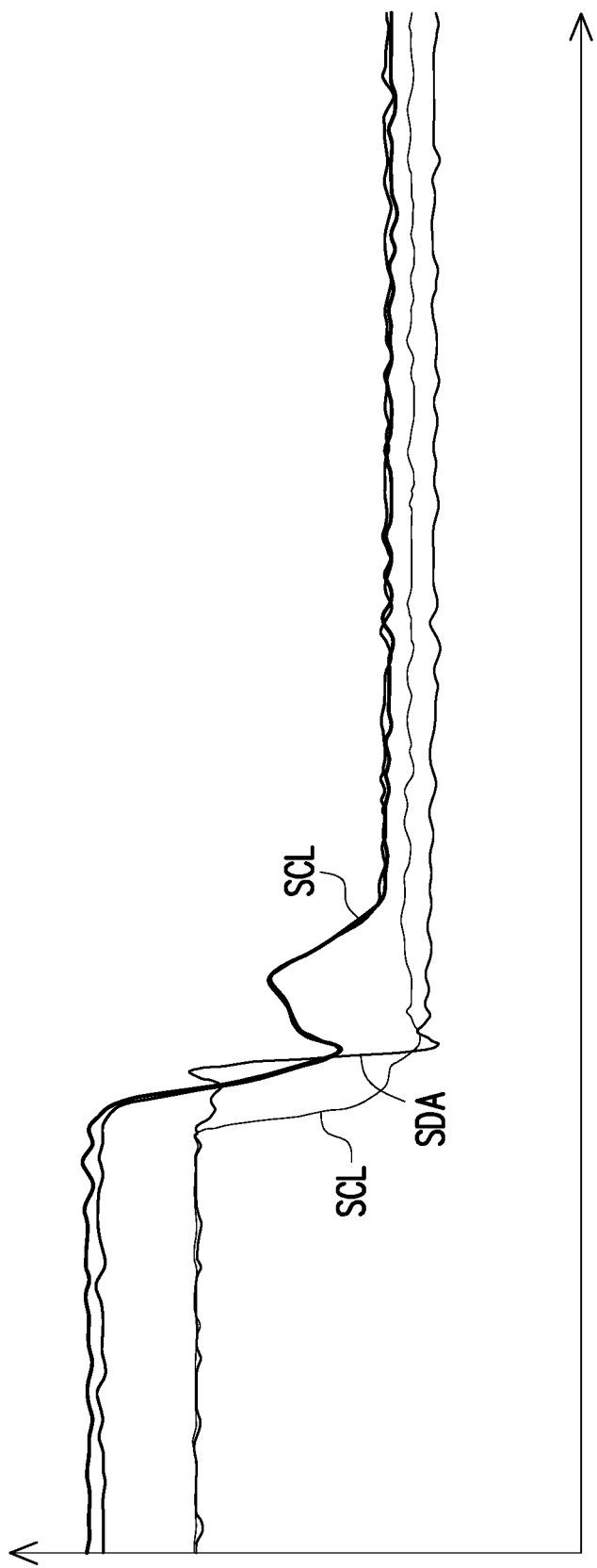
FIG. 1 is a schematic diagram illustrating a bus glitch signal.

According to the embodiment of the present invention, it calculates the measurement time when the clock signal SCL becomes the low level and the data signal SDA is the low level, and compares the calculated measurement time with the start condition hold time tHD,STA. When the measurement time is less than the hold time for start condition tHD,STA (prescribed time), it means that there is a signal transition that should not appear in the clock signal SCL, for example, the clock signal SCL becomes a voltage level higher than the low level. Namely, a glitch signal is occurred in the clock signal SCL (see the example shown in FIG. 1).

In this case, the control circuit will determine that the waveform of the start signal of the I²C bus is unqualified.

If the above measurement time is greater than the specified time, that is, greater than the start condition hold time tHD,STA, it means that the start signal waveform of the I²C bus is qualified, and no glitch signal is occurred in the clock signal SCL.

Figure 3:
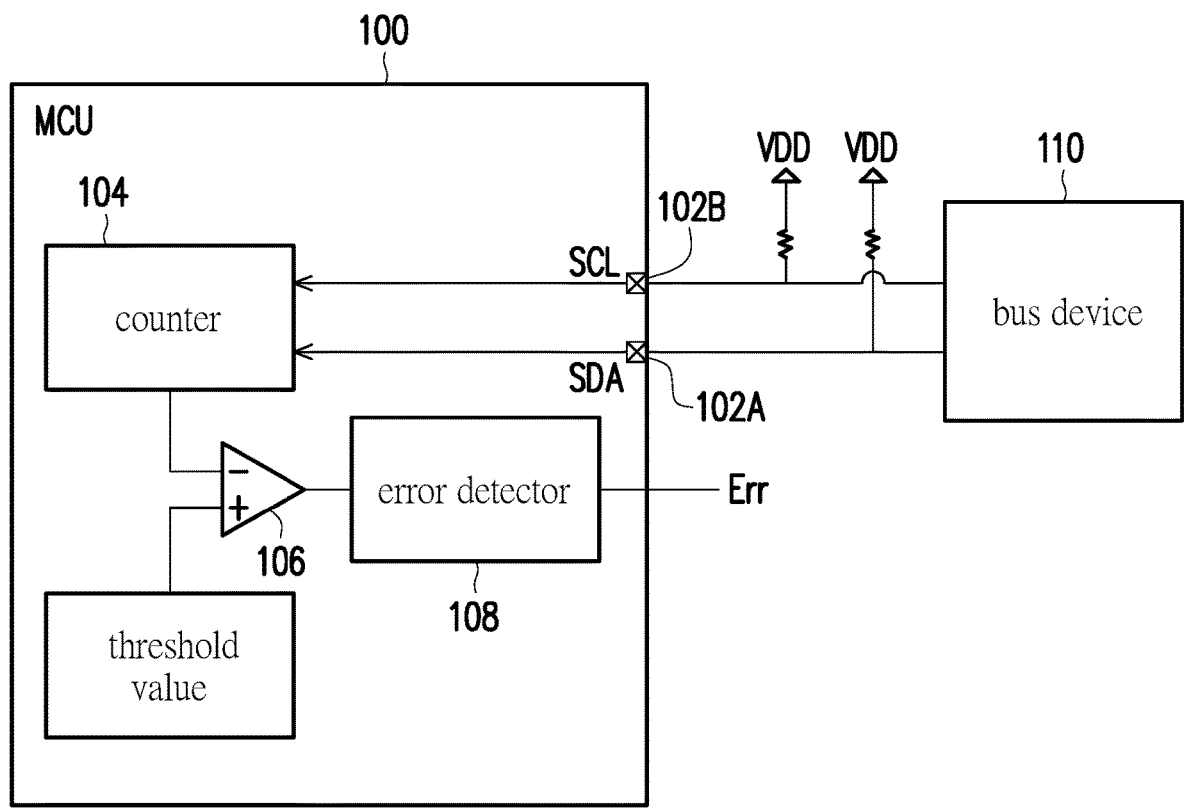
FIG. 3 is a block diagram illustrating a control circuit according to an embodiment of the present invention.

FIG. 3 is a schematic diagram illustrating a structure of a control circuit for the implement of determining whether the bus has an abnormal signal as shown in FIG. 2. As shown in FIG. 3, the control circuit 100 includes input ends 102A, 102B, a counter 104 and a comparator 106. The control circuit 100 may generally be implemented, for example, by a microcontroller (MCU) or other device having similar function. The control circuit 100 is coupled to a bus device 110, which may include a master device and a slave device. The input ends 102A, 102B are used for receiving the data signal SDA and the clock signal SCL from the bus device 110.

The counter 104 receives the data signal SDA and the clock signal SCL, and counts based on the waveforms of the data signal SDA and the clock signal SCL to calculate the measurement time that the data signal SDA is at the low level before the 106. clock signal SCL becomes the low level. The input end of the comparator 106 receives the output of the counter 104 (i.e., the measurement time) and the threshold value (i.e., the prescribed time (hold time) tHD,STA). The comparator 106 compares the inputs and outputs a comparison result to the error detector 108. When the measurement time is less than the prescribed time tHD,STA, the error detector 108 outputs an error result (flag) Err. Accordingly, the control circuit 100 can determine that the start waveform is unqualified, that is, a glitch signal is occurred in the clock signal SCL.

In this manner, the control circuit 100 indicates that the I²C bus has an error according to the generated error result Err. In this way, the hardware can ignore the start waveform this time, for example, the slave device in the bus device 110 can ignore the start waveform that is not qualified this time, and does not perform the data transception. In addition, the unqualified start waveform can also be processed through the system program, such as ignoring the start waveform.

Next, another method for determining whether the bus has an abnormal signal according to another embodiment of the present invention will be described. As shown in FIG. 2, this method uses the low level period tLOW and the high level period tHIGH of the clock signal SCL defined in the I²C bus specification. Generally, the high level period tHIGH is controlled by the master of the I²C bus device.

The high level period tHIGH is controlled by the I²C master device. Once the time is too short, the system can know in advance that the I²C master device may not support clock stretch or it can be ignored when there are other restrictions. In addition, the low level period tLOW can be controlled by the I²C master or slave. Once the low level period tLOW is too short, it may generate the glitch signal. In addition, if the low level period tLOW is too long, it may also make the I²C device not work properly. Therefore, in this embodiment, the low level period tLOW is measured. If there is the glitch signal, the potential that should be at the low level will suddenly rise, resulting in a reduction in the low level period tLOW. Therefore, in this embodiment, the time (measurement time) of the low level period of the clock signal SCL is measured, and the measurement time is compared with a prescribed time (threshold value). The prescribed time (threshold value) may be the default value (or minimum value) during the low level period, which is defined in the I²C bus specification. When the measurement time is less than the prescribed time (such as tLOW), it means that there is a signal transition that should not occur in the clock signal SCL. For example, the clock signal SCL becomes a voltage level higher than the low level. This means that the glitch signal is occurred in the clock signal SCL (see the example shown in FIG. 1). In this case, the control circuit will determine that the I²C bus is disturbed.

Figure 4:
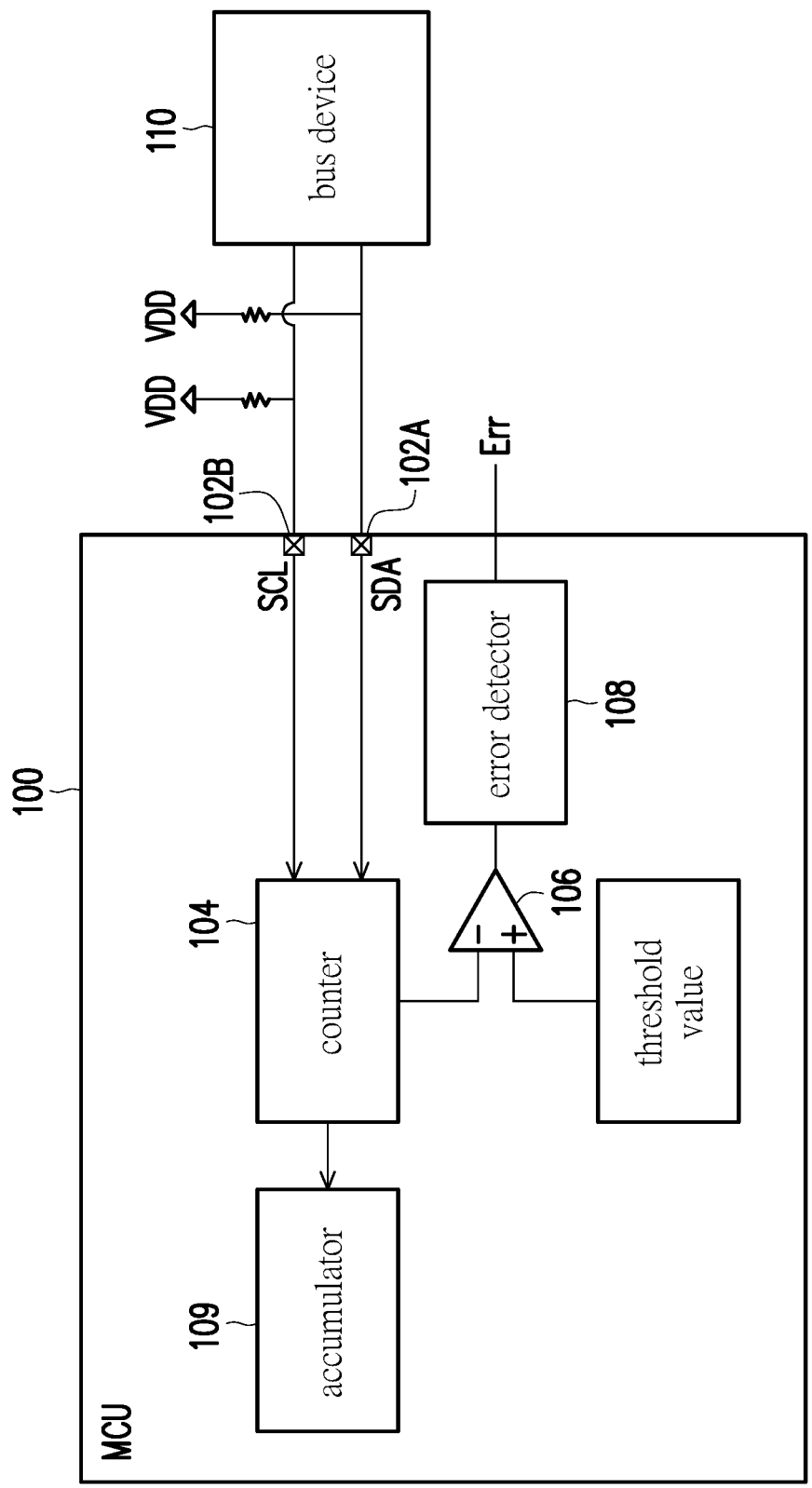
FIG. 4 is a block diagram illustrating a control circuit according to another embodiment of the present invention.

FIG. 4 is a block diagram illustrating a corresponding control circuit of this embodiment. As shown in FIG. 4, the control circuit 100 includes input ends 102A, 102B, a counter 104, a comparator 106 and an error detector 108. The control circuit 100 may further include an accumulator 109 coupled to the counter 104. Except for the accumulator 109, the hardware configuration of the present embodiment is the same as that of the control circuit shown in FIG. 3, but the operation is different.

The input ends 102A and 102B of the control circuit 100 are also used for receiving the data signal SDA and the clock signal SCL from the bus device 110. However, the counter 104 receives the data signal SDA and the clock signal SCL, and counts based on the waveforms of the data signal SDA and the clock signal SCL to calculate the low level time of the clock signal SCL as described above, for example, the time (measurement time) from when the clock signal SCL starts to change to the low level until the level becomes the high level. The counter 104 outputs the measurement time to comparator 106. In addition, the comparator 106 further receives a threshold value (such as the prescribed time, or tLOW), and compares the measurement time with the threshold value.

Similarly, the comparison result is output to the error detector 108. When the measurement time is less than the threshold value, the error detector 108 outputs a result (flag) Err. Accordingly, the control circuit 100 can determine that the waveform is unqualified (e.g., the low level period is too short); namely, the clock signal SCL is disturbed. Accordingly, the control circuit 100 indicates that the I²C bus has an error through the generated error result Err. In this way, the hardware can ignore this glitch signal and do not act. In addition, the abnormal signal can also be handled through the system program, such as ignoring the glitch signal and not acting.

In addition, the I²C bus configuration has a pull-high resistor, and its power consumption is generally proportional to the low level period tLOW. Therefore, the present embodiment can further use the measured tLOW time to further evaluate the average power consumption of the I²C bus, so as to achieve the purpose of abnormal power consumption detection. As shown in FIG. 4, the accumulator 109 can receive the output of the counter 104 and accumulate the time of each low level period calculated each time to evaluate the power consumption.

Figure 5:
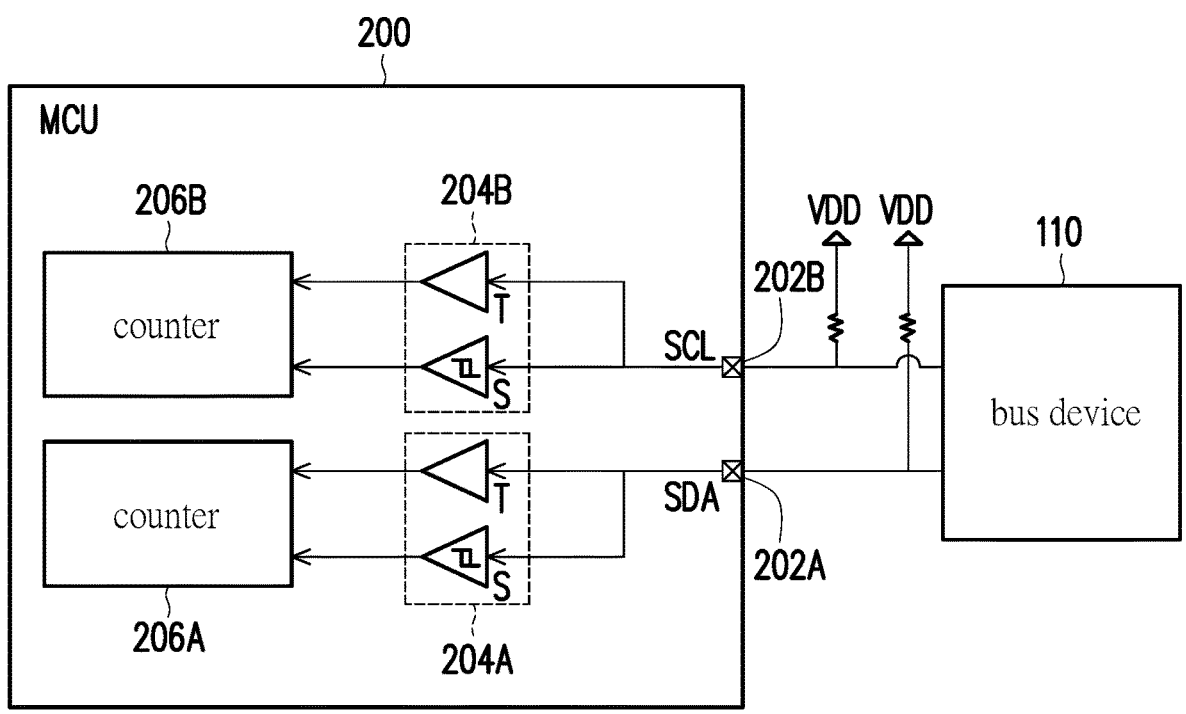
FIG. 5 is a block diagram illustrating a control circuit according to another embodiment of the present invention.

Next, another method for determining whether the bus has an abnormal signal according to an embodiment of the present invention will be described. FIG. 5 is a block diagram illustrating a corresponding control circuit of this embodiment. According to the method of the present embodiment, it uses two methods including the TTL input and Schmitt input provided in the control circuit to determine whether there is an abnormal signal in the bus.

Generally speaking, for example, take a 5V system as an example, when the TTL input method is used, if the input signal is below 1.2V, the input signal is determined to be the low level, and if the input signal is above 1.2V, the input signal is determined to be the high level. In addition, when the Schmitt input is used, the Schmitt trigger has a hysteresis effect. For example, when the input signal is below 5*0.4V=2V, the input signal is determined to be the low level; and when the input signal is more than 5*0.6V=3V, the input signal is determined to be the high level, in which, 0.4V and 0.6V are the thresholds of the Schmitt trigger. According to this embodiment, the counter counts the number of falling edges or rising edges of the I²C bus signal, such as counting the number of falling edges or rising edges during the low level period of the clock signal SCL or the data signal SDA. In the absence of the glitch signal, the number of counts (count values) of the falling edge or rising edge of the low level period of the clock signal SCL or the data signal SDA is consistent regardless of whether the TTL input method or the Schmitt trigger input method is used.

In one embodiment, the counting of the falling edge (or rising edge) of the low level period of the clock signal SCL using the TTL input method and the counting of the falling edge (or rising edge) of the low level period of the clock signal SCL using the Schmitt input method) are compared. When the count values obtained by these two methods are inconsistent, it means that the I²C bus is disturbed. At this time, an error flag will be generated to ignore the action of this period, thereby avoiding malfunction.

FIG. 5 is a block diagram of a control circuit corresponding to this embodiment. As shown in FIG. 5, the control circuit 200 receives the data signal SDA and the clock signal SCL from the bus device 100. The data signal SDA and the clock signal SCL are provided to the level determination elements 204A and 204B including the TTL level determination element T and the Schmitt trigger level determination element S, respectively. Taking the clock signal SCL as an example, the TTL level determination element T of the level determination element 204B determines whether the input signal is the low level or the high level, and the Schmitt trigger level determination element S of the level determination element 204B also determines whether the input signal is the low level or the high level. The level determination element 204A also performs the same determination on the data signal SDA.

In addition, the counters 206A and 206B are respectively coupled to the outputs of the level determination elements 204A and 204B. For example, after the counter 206B receives the output from the level determination element 204B, the falling edge (or rising edge) of the low level period of the clock signal SCL will be counted for the signal output from the TTL level determination element T (for example, the first counting unit is used), and at the same time, the falling edge (or rising edge) of the low level period of the clock signal SCL is counted for the signal output from the Schmitt trigger level determination element S (for example, a second counting unit is used). Afterwards, the number of falling edges (or rising edges) of the signal output from the TTL level determination element T and the number of falling edges (or rising edges) of the signal output from the Schmitt trigger level determination element S are compared by a comparator. When the comparison results of the two are inconsistent, the error detector can output the error flag Err to indicate that the signal of the I²C bus has error; namely, there is glitch signal. In this way, the hardware can ignore this glitch signal and do not act. In addition, the abnormal signal can also be processed through the system program, for example, the glitch signal is ignored and no action is made.

Implementations of the counter are described by taking the counter 206B as an example. First, the counter 206B may include two counters, each of which is coupled to the TTL level determination element T and the Schmitt trigger level determination element S of the level determination element 204B, respectively. The two counters will count the numbers of the falling edges (or rising edges) of the output of the TTL level determination element T and the output of the Schmitt trigger level determination element S, respectively. When the count values of the two counters are equal, it means that the signal is normal.

Furthermore, according to another embodiment, the counter 206B may include one counter. In this example, for example, when the TTL level determination element T determines that there is a falling edge (or a rising edge), the count value is increased by one unit (for example, 1), otherwise the Schmitt trigger level determination element S determines that there is a falling edge (or rising edge), the count value is decreased by one unit (for example, 1). In this way, if the final count value of the counter is 0, it means that the counted number of falling edges (or rising edges) determined by the TTL level determination element T and the counted number of falling edges (or rising edges) determined by the Schmitt trigger level determination element S are equal, i.e., the signal is normal. If the final count value of the single counter is not 0, the error detector can output the error flag Err to indicate that the signal of the I²C bus has error, i.e., there is glitch signal.

As described above, the present invention provides several methods to detect whether the clock signal of the bus has abnormal state transition during the low level period, so as to determine whether the bus is disturbed. Furthermore, in the case of the glitch signal being occurred, the system can send an error flag, so that the bus device can ignore the corresponding action of this period, so as to avoid the occurrence of malfunction.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A control circuit for detecting a glitch signal on a bus, comprising:
   input ends, respectively receiving a data signal and a clock signal from the bus;
   a counter, for calculating a time or a number of times in a low level period of the clock signal;
   a comparator, receiving an output of the time counted by the counter and a threshold value, and generating a comparison result by comparing the time and the threshold value; and
   an error detector, coupled to the comparator to receive the comparison result, and generating an error flag,
   wherein when the comparison result indicates that there is a level change during the low level period of the clock signal, the error detector generates an error flag.

2. The control circuit as claimed in claim 1, wherein the counter is configured to measure a measurement time that the data signal is at a low level before the clock signal becomes a low level,
   the comparator compares the measurement time with the threshold value, and the error detector generates the error flag when the measurement time is less than the threshold value,
   wherein the threshold value is a hold time for start condition defined by the bus.

3. The control circuit according to claim 1, wherein the counter is configured to measure a measurement time during the low level period of the clock signal,
the comparator compares the measurement time with the threshold vale, and when the measurement time is less than the threshold value, the error detector generates the error flag,
the threshold value is a default value of the low level period defined by the bus.

4. The control circuit according to claim 3, further comprising an accumulator, coupled to the counter for accumulating the low level period of each cycle of the clock signal.

5. The control circuit according to claim 1, further comprising a first level determination element and a second level determination element for respectively receiving the clock signal, respectively determining a level of the clock signal, and respectively outing an output signal of high or low level,
wherein the counter further comprises a first counting unit for receiving and counting a falling edge or a rising edge of the output signal of the first level determination element to generate a first count value, and a second counting unit for receiving and counting a falling edge or a rising edge of the output signal of the second level determination element to generate a second count value,
the comparator compares the first count value with the second count value to generate the comparison result, and
the error detector generates the error flag when the first count value is inconsistent with the second count value based on the comparison result.

6. The control circuit according to claim 5, wherein the first level determination element is a TTL level determination element, and the second level determination element is Smith Trigger level determination element.

7. The control circuit according to claim 1, further comprising a first level determination element and a second level determination element for respectively receiving the clock signal, respectively determining a level of the clock signal, and respectively outing an output signal of high or low level,
wherein the counter is configured that when the first level determination element determines that the output signal has a falling edge or a rising edge, a count value of the counter is increased by one unit; when the second level determination element determines that the output signal has a falling edge or a rising edge, the count value is decreased by one unit, and
the error detector generates the error flag when the count value of the counter is not 0.

8. A method for detecting glitch signal on a bus, comprising:
receiving a data signal and a clock signal of the bus;
calculating a time or a number of times based on a low level period of the clock signal;
comparing the time with a threshold value to generate a comparison result; and
based on the comparison result, when the comparison result indicates that there is a level change during the low level period of the clock signal, generating an error flag.

9. The method according to claim 8, wherein calculating the time is to measure a measurement time that the data signal is at a low level before the clock signal becomes a low level, and
the threshold value is a hold time for start condition defined by the bus, and the error flag is generated when the measurement time is less than the threshold value.

10. The method according to claim 8, wherein calculating the time is to measure a measurement time during the low level period of the clock signal, and
the threshold value is a default value of the low level period defined by the bus, and the error flag is generated when the measurement time is less than the threshold value.

11. The method according to claim 10, further comprising: accumulating the low level period of each cycle of the clock signal.

12. The method according to claim 8, further comprising:
using a first level determination method and a second level determination method, respectively determining a level of the clock signal, and outputting an output signal of high or low level;
counting the falling edge or the rising edge of the output signal generated by the first level determination to generate a first count value;
counting the falling edge or the rising edge of the output signal generated by the second level determination method to generate a second count value;
comparing the first count value with the second count value to generate the comparison result; and
based on the comparison result, generating the error flag when the first count value is inconsistent with the second count value.

13. The method according to claim 12, wherein the first level determination method is based on TTL, and the second level determination method is based on the Schmitt trigger level determination element.

14. The method according to claim 8, further comprising:
using a first level determination method and a second level determination method, determining a level of the clock signal, and outing an output signal of high or low level;
when the first level determination method determines that the output signal has a falling edge or a rising edge, a count value is increased by one unit;
when the second level determination method determines that the output signal has a falling edge or a rising edge, the count value is decreased by one unit; and
when the count value is not 0, generating the error flag.

* * * * *